(12) United States Patent
Park

(10) Patent No.: US 12,464,844 B2
(45) Date of Patent: Nov. 4, 2025

(54) IMAGE SENSING DEVICE

(71) Applicant: SK hynix Inc., Icheon-si (KR)

(72) Inventor: Soon Yeol Park, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 969 days.

(21) Appl. No.: 17/331,200

(22) Filed: May 26, 2021

(65) Prior Publication Data

US 2022/0254818 A1 Aug. 11, 2022

(30) Foreign Application Priority Data

Feb. 9, 2021 (KR) .................. 10-2021-0018444

(51) Int. Cl.
H01L 27/146 (2006.01)
G01S 7/481 (2006.01)
(Continued)

(52) U.S. Cl.
CPC .......... *H10F 39/807* (2025.01); *G01S 7/4816* (2013.01); *G01S 17/894* (2020.01);
(Continued)

(58) Field of Classification Search
CPC ........... H01L 27/1463; H01L 27/14603; H01L 27/14627; H01L 27/14643; H01L 31/107;
(Continued)

(56) References Cited

U.S. PATENT DOCUMENTS 5,831,322 A 11/1998 Dabrowski et al.
2007/0194356 A1 8/2007 Moon et al.
(Continued)

FOREIGN PATENT DOCUMENTS

CN 106057958 A * 10/2016 .......... H01L 31/107
CN 109585466 A 4/2019
(Continued)

OTHER PUBLICATIONS

Request for the Submission of an Opinion for KR Appl. No. 10-2021-0018444, mailed on May 17, 2025, 16 pages with English translation.
(Continued)

*Primary Examiner* — Ermias T Woldegeorgis
(74) *Attorney, Agent, or Firm* — Perkins Coie LLP

(57) ABSTRACT

Image sensing devices are disclosed. In some implementations, an image sensing device may include a substrate having an upper surface and a lower surface, a photoelectric conversion device formed in the substrate and structured to convert incident light into an electrical signal carrying information associated with the incident light, and an isolation structure formed in the substrate along at least a side surface and a bottom surface of the photoelectric conversion device. The isolation structure comprises a first isolation region which extends from the upper surface of the substrate to a first depth in the substrate to surround the side surface of the photoelectric conversion device, and a second isolation region which is formed in the substrate below the bottom surface of the photoelectric conversion device, the second isolation region electrically connected with the first isolation region.

16 Claims, 4 Drawing Sheets

(51) Int. Cl.
   *G01S 17/894* (2020.01)
   *H10F 39/00* (2025.01)
   *H10F 39/18* (2025.01)
   *H10F 30/225* (2025.01)

(52) U.S. Cl.
   CPC ........... *H10F 39/18* (2025.01); *H10F 39/802* (2025.01); *H10F 39/8063* (2025.01); *H10F 30/225* (2025.01)

(58) Field of Classification Search
   CPC ....... G01S 7/4816; G01S 17/894; G01C 3/02; H04N 25/705; H10F 39/807; H10F 39/18; H10F 39/802; H10F 39/8063; H10F 30/225
   See application file for complete search history.

(56) References Cited

U.S. PATENT DOCUMENTS

| | | | | |
|---|---|---|---|---|
| 2014/0291481 | A1* | 10/2014 | Zhang | H01L 31/107 257/431 |
| 2016/0268220 | A1* | 9/2016 | Tsai | H01L 27/14627 |
| 2019/0081137 | A1 | 3/2019 | Yao et al. | |
| 2019/0096929 | A1* | 3/2019 | Chiang | H01L 27/14612 |
| 2019/0244986 | A1 | 8/2019 | Hynecek | |
| 2020/0105812 | A1 | 4/2020 | Sze | |
| 2020/0135776 | A1 | 4/2020 | Finkelstein | |

FOREIGN PATENT DOCUMENTS

| | | |
|---|---|---|
| JP | 2017005276 A | 1/2017 |
| KR | 20140119648 A | 10/2014 |
| KR | 20190037186 A | 4/2019 |
| TW | 201505163 A | 2/2015 |
| WO | 2020170841 A1 | 8/2020 |

OTHER PUBLICATIONS

The Second Office Action for CN Appl. No. 202111039090.1, mailed on Jun. 23, 2025, 15 pages with English translation.

* cited by examiner

IMAGE SENSING DEVICE

CROSS-REFERENCES TO RELATED APPLICATION

This patent document claims the priority and benefits of Korean application number 10-2021-0018444, filed on Feb. 9, 2021, which is incorporated herein by reference in its entirety.

TECHNICAL FIELD

The technology and implementations disclosed in this patent document generally relate to an image sensing device, more particularly to an image sensing device including an avalanche diode.

BACKGROUND

Time of flight (TOF) technology is a way of building up an image of a scene based on distance between the sensor and the subject by measuring the round trip time of a light signal provided by a light source.

Single-photon avalanche diode (SPAD) arrays are solid-state detectors that offer imaging capabilities at the level of individual photons. TOF sensors utilizing SPAD allow fast, accurate distance measurements.

SUMMARY

The technology disclosed in this patent document can be implemented in various embodiments to improve operational reliability of image sensing devices.

In some embodiments of the disclosed technology, an image sensing device may include a substrate having an upper surface and a lower surface, a photoelectric conversion device formed in the substrate and structured to convert incident light into an electrical signal carrying information associated with the incident light, and an isolation structure formed in the substrate along at least a side surface and a bottom surface of the photoelectric conversion device. The isolation structure comprises a first isolation region which extends from the upper surface of the substrate to a first depth in the substrate to surround the side surface of the photoelectric conversion device, and a second isolation region which is formed in the substrate below the bottom surface of the photoelectric conversion device, the second isolation region electrically connected with the first isolation region.

In some embodiments of the disclosed technology, an image sensing device may include a substrate having an upper surface and a lower surface, a photoelectric conversion device including a first impurity region having a first conductive type formed in the substrate and a second impurity region having a second conductive type to surround a side surface and a bottom surface of the first impurity region, a first isolation region configured to surround the side surface of the photoelectric conversion device, the first isolation region extending from the upper surface of the substrate to a first depth in the substrate, a third isolation region formed in the substrate, the third isolation region extending from the lower surface of the substrate toward a lower end of the first isolation region in the substrate, and a second isolation region formed in the substrate and aligned with the photoelectric conversion device, the second isolation region being in contact with the first isolation region and the third isolation region at both ends thereof.

In some embodiments of the disclosed technology, an image sensing device may include a substrate, a photoelectric conversion device and an isolation structure. The substrate may have an upper surface and a lower surface. The photoelectric conversion device may be formed at the substrate. The isolation structure may be formed at the substrate to surround a side surface and a bottom surface of the photoelectric conversion device. The isolation structure may include a first isolation region and a second isolation region. The first isolation region may make contact with the upper surface of the substrate to surround the side surface of the photoelectric conversion device. The second isolation region may be formed in the substrate to surround the bottom surface of the photoelectric conversion device. The second isolation region may be electrically connected with the first isolation region. The isolation structure may further include a third isolation region formed at the substrate and overlapped with the first isolation region. The third isolation region may include the other end configured to make contact with the lower surface of the substrate, and one end configured to make contact with the first isolation region and the second isolation region.

In some embodiments of the disclosed technology, an image sensing device may include a substrate, a photoelectric conversion device, a first isolation region, a third isolation region and a second isolation region. The substrate may have an upper surface and a lower surface. The photoelectric conversion device may include a first impurity region having a first conductive type formed at the substrate, and a second impurity region having a second conductive type configured to surround a side surface and a bottom surface of the first impurity region. The first isolation region may be configured to surround a side surface of the photoelectric conversion device. The first isolation region may include one end configured to make contact with the upper surface of the substrate. The third isolation region may be formed at the substrate. The third isolation region may include the other end configured to make contact with the lower surface of the substrate, and one end configured to make contact with the first isolation region. The second isolation region may be formed in the substrate to be overlapped with the photoelectric conversion device. The second isolation region may include both ends configured to make contact with the first isolation region and the third isolation region.

In some embodiments of the disclosed technology, the first isolation region and the second isolation region may be configured to isolate the photoelectric conversion devices including an avalanche diode to prevent an electrical crosstalk and to reduce a dark current rate. Particularly, an isolation voltage may be applied to the first isolation region and the second isolation region to maintain operational characteristics of the photoelectric conversion device, to effectively prevent the electrical crosstalk and to more reduce the dark current rate.

Further, the third isolation region may prevent an optical crosstalk between adjacent unit pixels. The first isolation region and the second isolation region may trap a dark current source, which may be caused by the third isolation region including a trench type isolation layer, to more decrease the dark current ratio.

As a result, the image sensing device may include the first to third isolation regions to have improved operational characteristics.

DETAILED DESCRIPTION

Features of the technology disclosed in this patent document are described by examples of an image sensing device.

The disclosed technology can be implemented in some embodiments to improve operational reliability of image sensing devices by, for example, reducing or minimizing an optical crosstalk and an electrical crosstalk in the image sensing device including an avalanche diode.

Figure 1:
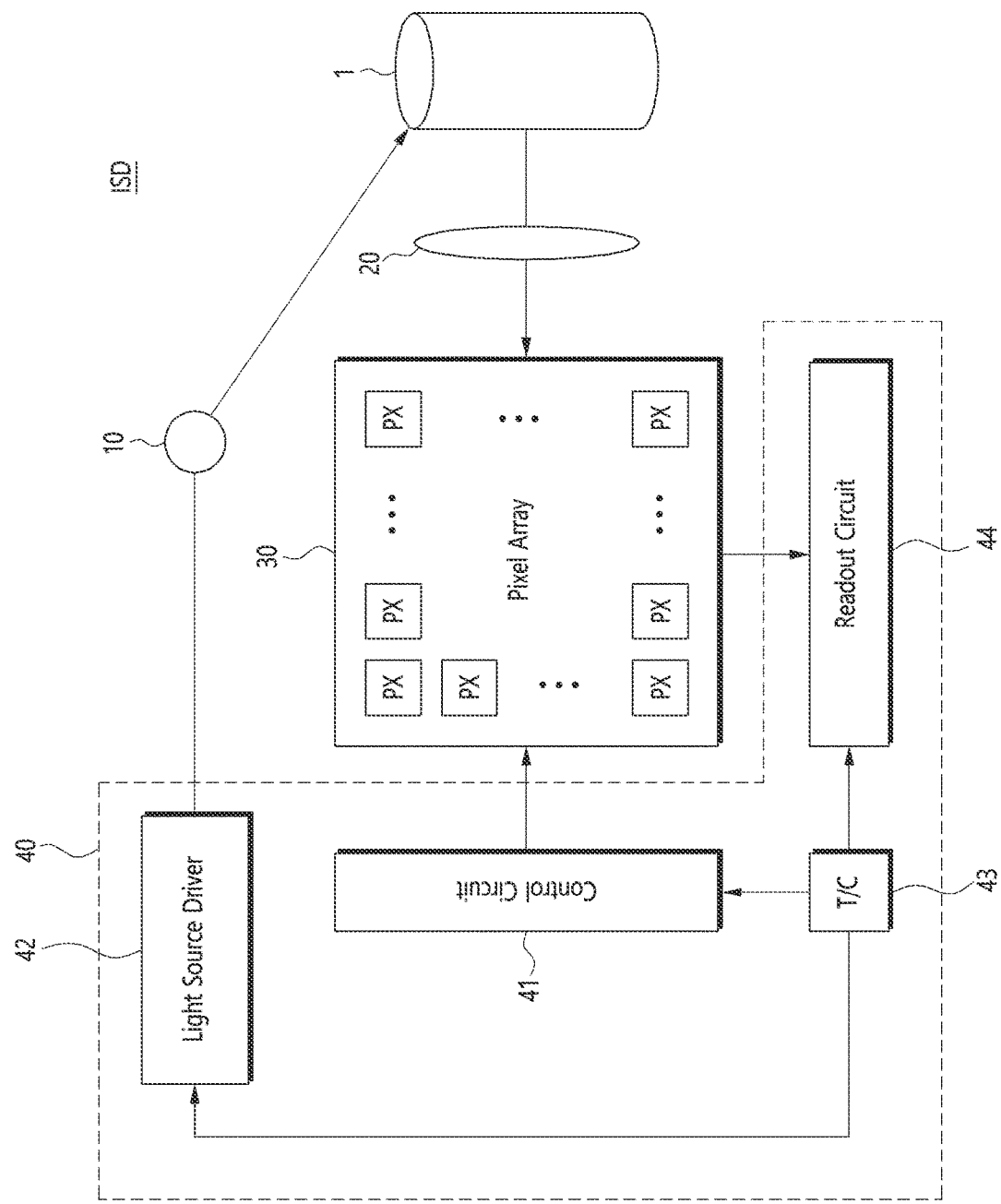
FIG. 1 is an example configuration of an image sensing device based on some embodiments of the disclosed technology.

FIG. 1 is an example configuration of an image sensing device based on some embodiments of the disclosed technology.

Referring to FIG. 1, an image sensing device ISD implemented based on some embodiments of the disclosed technology may measure a distance from an object 1 using a time of flight (TOF) technique. The image sensing device ISD may include a light source 10, a lens module 20, a pixel array 30 and a control circuit module 40.

The light source 10 may emit light toward the object 1. The light source 10 may generate light (or photons) having a specific wavelength such as infrared light or visible light. Examples of the light source 10 may include a laser diode, a light emitting diode (LED), a near infrared laser (NIR), a point light source, a white light lamp, a monochromatic illuminator, and a combination thereof. For example, the light source 10 may emit infrared light having a wavelength of about 800 nm to about 1,000 nm. As shown in FIG. 1, the image sensing device ISD may include one light source 10. Alternatively, the image sensing device ISD may include a plurality of the light sources 10 arranged near or around the lens module 20.

The lens module 20 may be used to converge light reflected from the object 1 onto unit pixels of the pixel array 30. For example, the lens module 20 may include a condensing lens having a glass surface or plastic surface, a cylindrical optical element, or others. The lens module 20 may include a plurality of lenses arranged along an optical axis.

The pixel array 30 may include a plurality of unit pixels PX arranged in rows and columns in a two-dimensional matrix array.

Each of the unit pixels PX may convert light incident through the lens module 20 into an electrical signal corresponding to an intensity of the light. The pixel signal may include information corresponding to the distance between the pixel array 30 (or the light source 10) and the object 1, in addition to or instead of information about a color of the object 1. Each of the unit pixels PX may include a photoelectric conversion device. The photoelectric conversion device may include an avalanche diode. For example, the photoelectric conversion device may include a single photon avalanche diode (SPAD).

In some implementations, the single photon avalanche diode may be a photosensitive P-N junction that is used as a photoelectric conversion device. The single photon avalanche diode may detect a single photon reflected from an object to generate a current pulse corresponding to the detected single photon. In SPAD, when the reverse bias is so high that an impact ionization occurs to cause an avalanche current to develop. A large avalanche of current carriers grows and can be triggered from as few as a single photon-initiated carrier. More specifically, an avalanche breakdown may be triggered by a single photon in Geiger mode where a reverse bias voltage is applied such that a voltage between a cathode and an anode is higher than a breakdown voltage to generate the current pulse. The avalanche breakdown may be generated at a depletion region in the single photon avalanche diode. When the reverse bias voltage is applied to the single photon avalanche diode to increase an electric field, electrons are generated by the photons incident and create a strong electric field, causing the impact ionization to occur and thereby generating an electron-hole pair. In the single photon avalanche diode operated in the Geiger mode where the reverse bias voltage higher than the breakdown voltage is applied, carriers such as electrons or holes, which may be generated by the incident light, and the electrons and the holes, which may be generated by the impact ionization, collide against each other to generate numerous carriers. Therefore, even with a single photon, the avalanche breakdown may be triggered to generate a measurable current pulse.

The control circuit module 40 may control the light source 10 to emit the light toward the object 1. The control circuit module 40 may operate the unit pixels PX of the pixel array 30 to process the pixel signal corresponding to the reflected light from the object 1, thereby measuring the distance between the pixel array 30 (or the light source 10) and a surface of the object 1.

The control circuit module 40 may include a control circuit 41, a light source driver 42, a timing controller 43 and a readout circuit 44.

The control circuit 41 may operate the unit pixels PX of the pixel array 30 in response to a timing signal provided by the timing controller 43. For example, the control circuit 41 may generate a control signal for selecting and controlling at least one row line among a plurality of row lines. The control signal may include a demodulation control signal for generating a hole current in the substrate, a reset signal for controlling a reset transistor, a transmission signal for controlling a transmission of an optical charge accumulated in a detection node, a floating diffusion signal for providing an additional electric capacity in a high irradiance condition, a selection signal for controlling a selection transistor, for example.

The timing controller 43 may generate the timing signal for controlling the operations of the control circuit 41, the light source driver 42 and the readout circuit 44.

The readout circuit 44 may process pixel signal generated by the pixel array 30 based on control signals and/or instructions received from the timing controller 43 to generate pixel data (e.g., digital signals). The readout circuit 44 may include a correlated double sampler (CDS) for performing a correlated double sampling with respect to the pixel signals outputted from the pixel array 30. In some implementations, the readout circuit 44 may include an analog-digital converter configured to convert output signals from the CDS into digital signals. Furthermore, the readout circuit 44 may include a buffer circuit configured to temporarily store the pixel data outputted from the analog-digital converter and to output the pixel data based on control signals and/or instructions received from the timing controller 43.

As will be discussed below, the unit pixel implemented based on some embodiments of the disclosed technology can include the avalanche diode and an isolation structure configured to isolate the adjacent unit pixels from each other.

Figure 2:
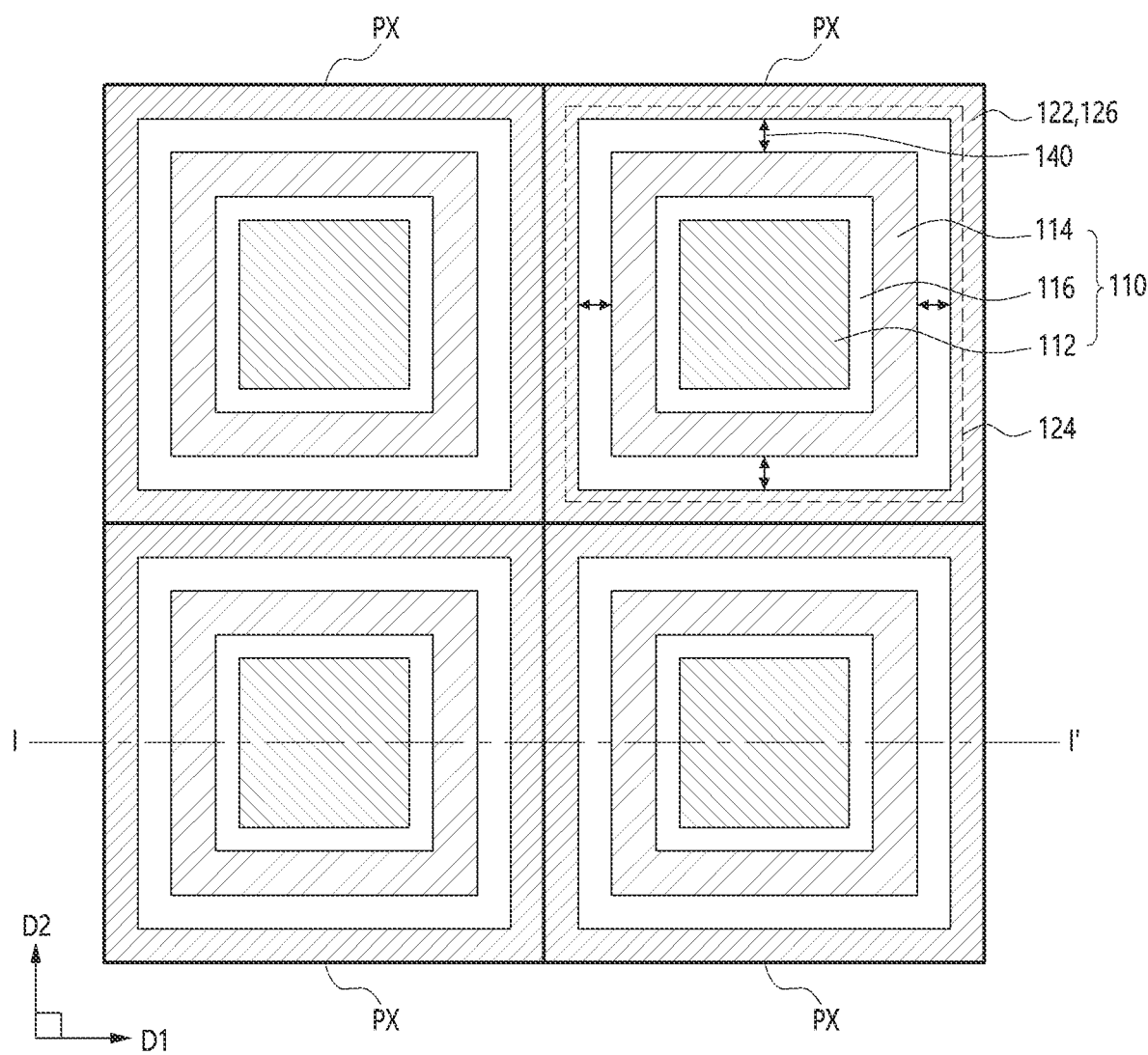
FIG. 2 is a plan view illustrating a part of a pixel array based on some embodiments of the disclosed technology.
Figure 3:
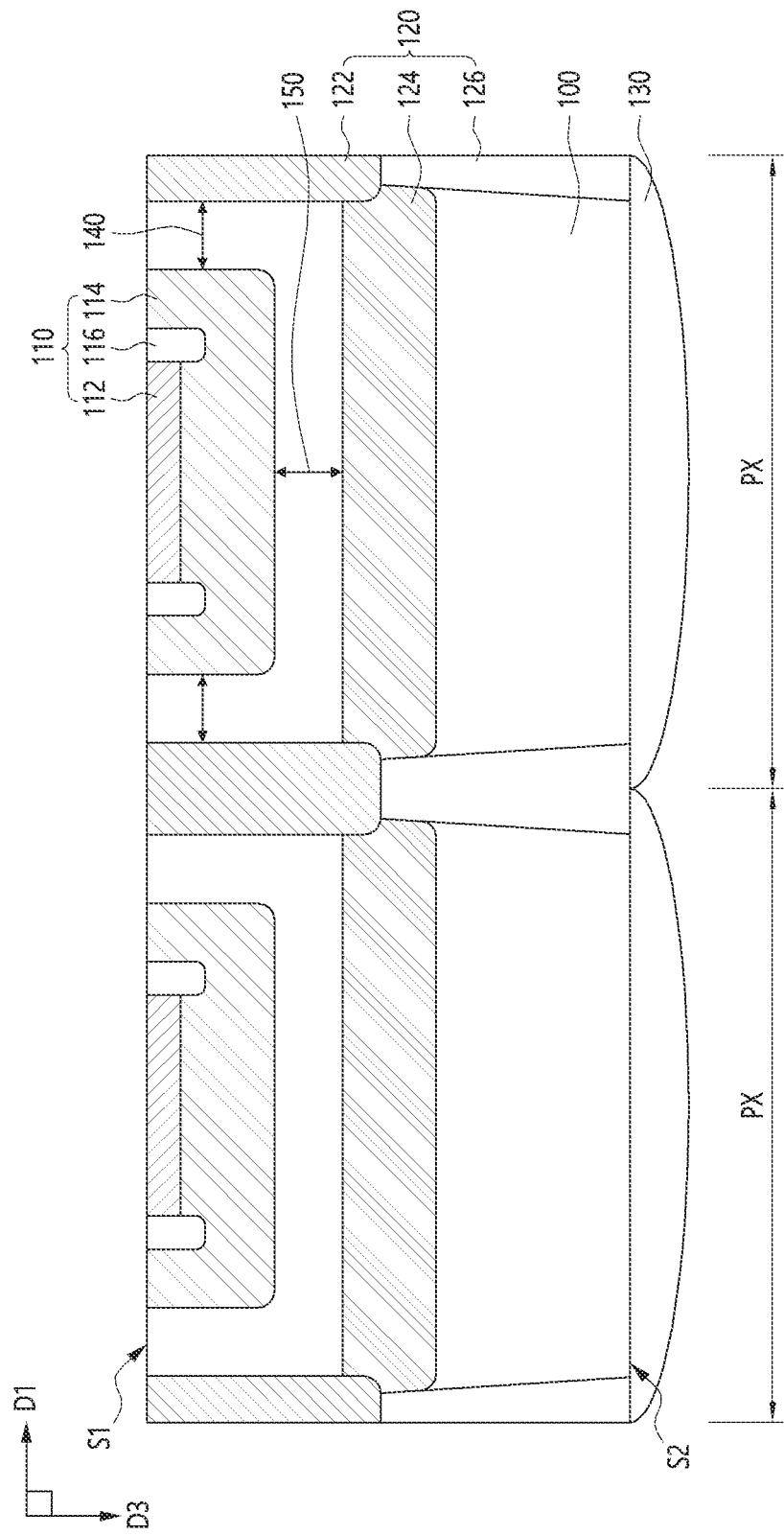
FIG. 3 is a cross-sectional view taken along a line I-I' in FIG. 2.
Figure 4:
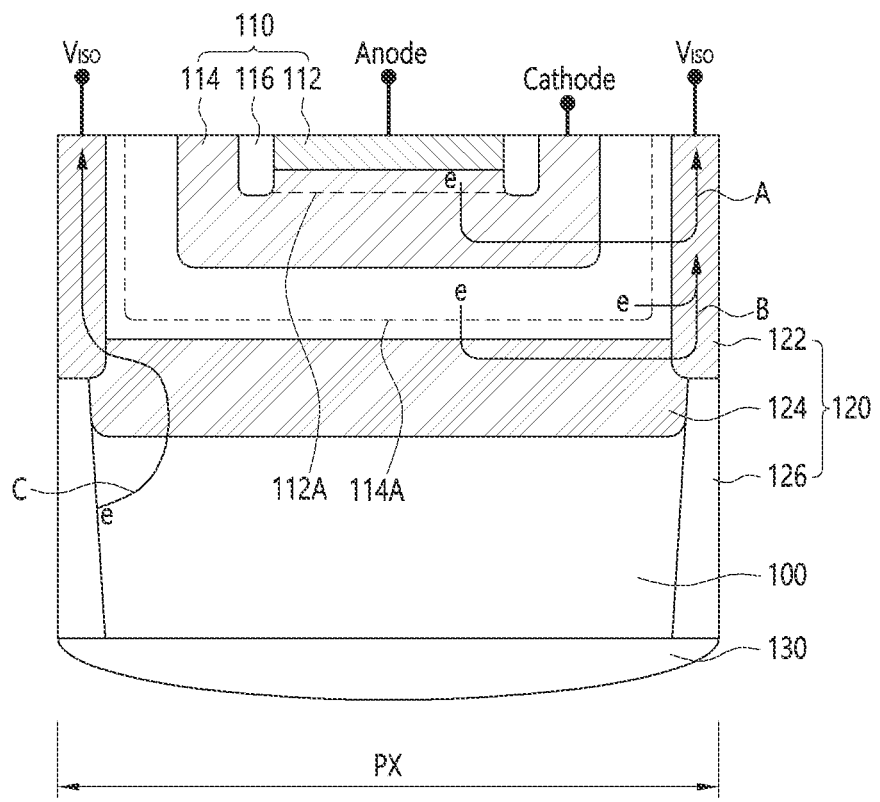
FIG. 4 is a cross-sectional view illustrating a unit pixel and movements of charges for generating an electrical crosstalk and a dark current based on some embodiments of the disclosed technology.

FIG. 2 is a plan view illustrating a part of a pixel array based on some embodiments of the disclosed technology, FIG. 3 is a cross-sectional view taken along a line I-I' in FIG. 2, and FIG. 4 is a cross-sectional view illustrating a unit pixel and movements of charges for generating an electrical crosstalk and a dark current based on some embodiments of the disclosed technology.

In FIG. 2 and FIG. 3, a first direction D1, a second direction D2 and a third direction D3 may be substantially perpendicular to each other. For example, in an XYZ coordinate, the first direction D1 may be an X-direction, the second direction D2 may be a Y-direction, and a third direction D3 may be a Z-direction.

In some implementations, a first conductive type and a second conductive type may be complimentary conductive types. For example, when the first conductive type may be a P type, the second conductive type may be an N type. In contrast, when the first conductive type may be the N type, the second conductive type may be the P type. In example embodiments, the first conductive type may be the P type and the second conductive type may be the N type.

Referring to FIGS. 2 and 3, the pixel array 30 of example embodiments may include a plurality of unit pixels PX sequentially arranged in a two-dimensional array. Each of the unit pixels PX may be used to measure a distance from an object using a time of flight (TOF) technique.

Each of the unit pixels PX may include a substrate 100, a photoelectric conversion device 110 and an isolation structure 120. The substrate 100 may have an upper surface S1 and a lower surface S2. The photoelectric conversion device 110 may be formed at the substrate 100. In some implementations, the photoelectric conversion device 110 may be formed in the substrate 100 such that an upper portion of the photoelectric conversion device 110 is at the upper surface S1 of the substrate 100. In one example, the upper portion of the photoelectric conversion device 110 is exposed through the upper surface S1 of the substrate 100. The isolation structure 120 may be formed at the substrate 100 to surround a side surface and a bottom surface of the photoelectric conversion device 110.

The substrate 100 may include a bulk single-crystalline silicon wafer, a silicon-on-insulation (SOI) wafer, a compound semiconductor wafer such as Si—Ge, a wafer including a silicon epitaxial layer or others. For example, the substrate 100 may include a bulk single-crystalline silicon wafer doped with first conductive type impurities, for example, P type impurities.

Although not depicted in the drawings, the control circuit module 40 for controlling the photoelectric conversion device 110 may be formed on the upper surface S1 of the substrate 100. The lower surface S2 of the substrate 100 may be a surface on which the light is incident. Thus, a microlens 130 may be formed on the lower surface S2 of the substrate 100. Although not depicted in the drawings, an optical filter and/or a grid pattern may be formed on the lower surface S2 of the substrate Sub.

The photoelectric conversion device 110 may include an avalanche diode. For example, the photoelectric conversion device 110 may include a single photon avalanche diode (SPAD).

In some implementations, the photoelectric conversion device 110 may include a first impurity region 112 having a first conductive type and a second impurity region 114 having a second conductive type. The first impurity region 112 may correspond to an anode of the single photon avalanche diode. The second impurity region 114 may correspond to a cathode of the single photon avalanche diode. The first impurity region 112 may be formed in the second impurity region 114 and may extend from the upper surface S1 of the substrate 100 to a certain depth. The first impurity region 112 may have a plate shape. The second impurity region 114 may be formed in the substrate 100 and a portion of the second impurity region 114 may extend from the upper surface S1 of the substrate 100 to a certain depth in the substrate 100. The second impurity region 114 may be structured to surround a side surface and a bottom surface of the first impurity region 112. The second impurity region 114 may have a cylindrical shape and may be in contact with the bottom surface of the first impurity region. Thus, the second impurity region 114 may have a planar annular shape when viewed from the upper surface S1 of the substrate 100. The second impurity region 114 may have a planar plate shape when viewed from the lower surface S2 of the substrate 100. The second impurity region 114 may have a planar U shape.

The photoelectric conversion device 110 may further include a guard ring 116 formed in the second impurity region 114. The guard ring 116 may be arranged at the upper surface S1 of the substrate 100 to surround the side surface of the first impurity region 112. The guard ring 116 may be in contact with the side surface of the first impurity region 112 to surround the first impurity region 112. A depth of the guard ring 116 measured from the upper surface S1 of the substrate 100 may be greater than a depth of the first impurity region 112 and less than a depth of the second impurity region 114. The guard ring 116 may include an impurity region having the first conductive type. The guard ring 116 with the impurity region having the first conductive type may have a doping concentration lower than a doping concentration of the first impurity region 112. The guard ring 116 may include a trench type isolation layer. The guard ring 116 with the trench type isolation layer may include a trench formed at the upper surface S1 of the substrate 100, and an isolation layer formed in the trench.

In some implementations, each of the first impurity region 112 and the second impurity region 114 may include a single impurity region. In other implementations, the first impurity region 112 may include a plurality of impurity regions that includes the first conductive type impurity and is stacked on top of one another along the third direction D3. In some implementations, the second impurity region 114 may include a plurality of impurity regions that includes the second conductive type impurity and is stacked on top of one another along the third direction D3. The impurity regions of the first impurity region 112 stacked in the third direction D3 may have different doping concentrations. Likewise, the impurity regions of the second impurity region 114 stacked in the third direction D3 may have different doping concentrations. For example, the doping concentration may decrease from the upper surface S1 toward the lower surface S2 in the substrate 100 to prevent or reduce a punch-through effect that would have been caused by an expansion of a depletion region, thereby improving breakdown voltage characteristics.

The isolation structure 120 may include a first isolation region 122, a second isolation region 124 and a third isolation region 126 that are structured to isolate the unit pixels PX from each other or reduce an optical and/or electrical crosstalk between adjacent unit pixels PXs. In each of the unit pixels PX, the first isolation region 122 may be structured to surround the side surface of the photoelectric conversion device 110. The second isolation region 124 may be structured to surround the bottom surface of the photoelectric conversion device 110. Thus, the photoelectric conversion device 110 may be electrically isolated or reduce an optical and/or electrical crosstalk between adjacent unit pixels PXs by the first isolation region 122 and the second isolation region 124.

The first isolation region 122 and the second isolation region 124 may prevent or reduce an electrical crosstalk between the adjacent unit pixels PX. In some implementations, the first isolation region 122 and the second isolation region 124 may trap electrons that would have caused a dark current, thereby reducing a dark current rate (DCR). The first isolation region 122 and the second isolation region 124 may include an impurity region having the second conductive type impurity, which is the same as the second conductive type of the second impurity region 114 in the photoelectric conversion device 110. The first isolation region 122 may have a doping concentration greater than a doping concentration of the second isolation region 124. The second isolation region 124 may be electrically connected with the first isolation region 122.

In order to effectively prevent or reduce the electrical crosstalk and effectively decrease the dark current rate, the first isolation region 122 and the second isolation region 124 may be configured to receive an isolation voltage $V_{ISO}$ from the control circuit module 40 on the upper surface S1 of the substrate 100. When the first isolation region 122 and the second isolation region 124 include the impurity region having the second conductive type, the isolation voltage $V_{ISO}$ may be a positive voltage. For example, the isolation voltage $V_{ISO}$ may be higher than a ground voltage GND and less than a breakdown voltage of the photoelectric conversion device 110. In contrast, when the first isolation region 122 and the second isolation region 124 may include the impurity region having the first conductive type, the isolation voltage $V_{ISO}$ may be a negative voltage. For example, the isolation voltage $V_{ISO}$ may have an absolute value higher than the ground voltage GND and less than the breakdown voltage of the photoelectric conversion device 110.

The isolation voltage $V_{ISO}$ may be applied to the first isolation region 122 and the second isolation region 124 to prevent an avalanche current between the substrate 100 and the first and second isolation regions 122 and 124. Even if the isolation voltage $V_{ISO}$ is applied to the first isolation region 122 and the second isolation region 124, the isolation voltage $V_{ISO}$ may have no influence on operational characteristics of the photoelectric conversion device 110 adjacent to the first isolation region 122 and the second isolation region 124, i.e., the single photon avalanche diode.

In some implementations, each of the first isolation region 122 and the second isolation region 124 may include one impurity region. In other implementations, each of the first isolation region 122 and the second isolation region 124 may include a plurality of impurity regions that includes the second conductive type impurity and is stacked on top of one another along the third direction D3.

The first isolation region 122 may have one end formed at or near the upper surface S1 of the substrate 100. The first isolation region 122 may extends from the upper surface S1 of the substrate 100 in the third direction D3 to surround the side surface of the photoelectric conversion device 110. In one example, the first isolation region 122 may have a pipe shape. In this case, a horizontal cross-section of the first isolation region 122 may have a ring shape and a vertical cross-section of the first isolation region 122 may have a bar shape. Side surfaces of the first isolation region 122 may be spaced apart from the side surfaces of the photoelectric conversion device 110 facing the side surfaces of the first isolation region 122 by a first gap 140 along the first and second directions D1 and D2, thereby preventing or reducing a punch-through effect between the first isolation region 122 and the photoelectric conversion device 110. The first gap 140 may be sufficiently large such that the depletion region caused by the first isolation region 122 is not connected with the depletion region caused by the second impurity region 114 of the photoelectric conversion device 110. The first isolation region 122 may have a depth from the upper surface S1 of the substrate 100 greater than a depth of the photoelectric conversion device 110. That is, the depth of the first isolation region 122 may be greater than the depth of the second impurity region 114 of the photoelectric conversion device 110.

The second isolation region 124 may be formed in the substrate 100 and in contact with the first isolation region 122 and the third isolation region 126 at both ends. The second isolation region 124 may be aligned with the photoelectric conversion device 110 in the third direction D3 and may be structured to surround the bottom surface of the photoelectric conversion device 110. In one example, the second isolation region 124 may have a plate shape. The second isolation region 124 may have an upper surface spaced apart by a second gap 150 from the bottom surface of the photoelectric conversion device 110. The second gap 150 may prevent or reduce the punch-through effect between the second isolation region 124 and the photoelectric conversion device 110. The second gap 150 may be sufficiently large such that the depletion region caused by the second isolation region 124 is not connected with the depletion region caused by the second impurity region 114 of the photoelectric conversion device 110. In order to effectively prevent or reduce the punch-through effect between the second isolation region 124 and the photoelectric conversion device 110, the second gap 150 may be wider than the first gap 140.

The third isolation region 126 may prevent or reduce an optical crosstalk between the adjacent unit pixels PX. The third isolation region 126 may include a trench type isolation layer. The trench type isolation layer may include an isolation trench formed at the lower surface S2 of the substrate 100, and a gap-filling insulation layer formed in the isolation trench. The trench type isolation layer may further include a dielectric layer having a high dielectric constant inserted between the isolation trench and the gap-filling insulation layer to suppress the generation of the dark current caused by the third isolation region 126. The dielectric layer having the high dielectric constant may a plurality of dipoles for trapping charges acting as a source of the dark current.

The third isolation region 126 may have its lower end at the lower surface S2 of the substrate and may be in contact with the first isolation region 122 and the second isolation region 124 at its upper end. The third isolation region 126 may be overlapped with the first isolation region 122 in the third direction D3. That is, the third isolation region 126 may have a pipe shape. A horizontal cross-section of the third isolation region 126 may have an annular shape and a vertical cross-section of the third isolation region 126 may have a bar shape. The third isolation region 126 may have a depth from the lower surface S2 of the substrate 100 that is sufficiently deep to prevent the optical crosstalk between the adjacent unit pixels PX.

In some implementations, the upper end of the third isolation region 126 may be in contact with the lower end of the first isolation region 122. In other implementations, in order to effectively prevent or reduce the optical crosstalk, the upper end of the third isolation region 126 may be extended into the first isolation region 122. In this case, the first isolation region 122 may be structured to surround a side surface and a top surface of the upper end of the third isolation region 126.

In some example embodiments of the disclosed technology, the first isolation region 122 and the second isolation region 124 may be configured to isolate the photoelectric conversion devices 110 including the avalanche diode to prevent or reduce the electrical crosstalk, thereby reducing the dark current rate. In some implementations, the isolation voltage $V_{ISO}$ may be applied to the first isolation region 122 and the second isolation region 124 to maintain the operational characteristics of the photoelectric conversion device 110, effectively preventing or reducing the electrical crosstalk and decreasing the dark current rate.

Referring to FIG. 4, electrons (A and B in FIG. 4) may be generated by converting light incident upon a first depletion region 112A caused by the first impurity region 112 and a second depletion region 114A caused by the second impurity region 114 in the photoelectric conversion device 110. Those electrons may move into the second impurity region 114 of the adjacent photoelectric conversion device 110, generating the electrical crosstalk. In some implementations, electrons may be generated by incident light or a defect in a junction between the first impurity region 112 and the second impurity region 114 in the photoelectric conversion device 110, i.e., a P-N junction. Those electrons may also move into the second impurity region 114 of the photoelectric conversion device 110, generating the electrical crosstalk. However, the image sensing device based on some embodiments of the disclosed technology may release electric charges that are generated by light incident upon the first depletion region 112A and the second depletion region 114A and electric charges that are generated at the P-N junction due to the incident light or the internal defects, from the first and second isolation regions 122 and 124 to which the isolation voltage $V_{ISO}$ is applied, thereby preventing or reducing the electrical crosstalk.

In some implementations, the third isolation region 126 may prevent or reduce the optical crosstalk between the adjacent unit pixels. The first isolation region 122 and the second isolation region 124 may trap electric charges corresponding to the dark current, which may be caused by the third isolation region 126 including the trench type isolation layer, thereby further decreasing the dark current rate.

Referring FIG. 4, electrons (C in FIG. 4) may be generated at an interface of the third isolation region 126 including the trench type isolation layer to prevent the optical crosstalk. Those electrons may move into the photoelectric conversion device 110, increasing the dark current rate. However, the image sensing device based on some embodiments of the disclosed technology may release electric charges that are be generated in the third isolation region 126, from the first and second isolation regions 122 and 124 to which the isolation voltage VISO is applied, decreasing the dark current rate.

As a result, the first to third isolation regions 122, 124 and 126 allow the image sensing device to have improved operational characteristics.

Only a few implementations and examples are described and other implementations, enhancements and variations can be made based on what is described and illustrated in this patent document.

What is claimed is:

1. An image sensing device comprising:
a substrate having an upper surface and a lower surface;
a photoelectric conversion device formed in the substrate and structured to convert incident light into an electrical signal carrying information associated with the incident light; and
an isolation structure formed in the substrate along at least a side surface and a bottom surface of the photoelectric conversion device,
wherein the isolation structure comprises:
a first isolation region which extends from the upper surface of the substrate to a first depth in the substrate to surround the side surface of the photoelectric conversion device; and
a second isolation region which is formed in the substrate below the bottom surface of the photoelectric conversion device, the second isolation region electrically connected with the first isolation region,
wherein the first isolation region and the second isolation region are configured to receive an isolation voltage that has an absolute value higher than a ground voltage and lower than an absolute value of a breakdown voltage of the photoelectric conversion device.

2. The image sensing device of claim 1, wherein the isolation structure further comprises a third isolation region formed between a bottom surface the first isolation region and the lower surface of the substrate.

3. The image sensing device of claim 2, wherein the third isolation region comprises a trench type isolation layer structured to include an isolation trench formed in the substrate filled with a gap-filling insulation layer.

4. The image sensing device of claim 2, wherein an upper surface of the third isolation region is in contact with the first isolation region and the second isolation region.

5. The image sensing device of claim 1, wherein a side surface of the first isolation region is spaced apart from the side surface of the photoelectric conversion device facing the side surface of the first isolation region by a first gap, and an upper surface of the second isolation region is spaced apart from the bottom surface of the photoelectric conversion device facing the upper surface of the second isolation region by a second gap.

6. The image sensing device of claim 5, wherein the second gap is greater than the first gap.

7. The image sensing device of claim 1, wherein the first isolation region and the second isolation region comprise impurity regions including a same conductive type impurity.

8. The image sensing device of claim 1, wherein the first isolation region has a pipe shape, the second isolation region has a plate shape, and the first and second isolation regions are structured to isolate the photoelectric conversion device.

9. The image sensing device of claim 1, wherein the first isolation region has a depth measured from the upper surface of the substrate greater than a depth of the photoelectric conversion device.

10. An image sensing device comprising:
a substrate having an upper surface and a lower surface;
a photoelectric conversion device including a first impurity region having a first conductive type formed in the substrate and a second impurity region having a second conductive type to surround a side surface and a bottom surface of the first impurity region;
a first isolation region configured to surround a side surface of the photoelectric conversion device, the first isolation region extending from the upper surface of the substrate to a first depth in the substrate;

a second isolation region formed in the substrate to surround a bottom surface of the photoelectric conversion device while contacting a bottom surface of the first isolation region; and a third isolation region formed to extend from the bottom surface of the first isolation region to the lower surface of the substrate, an upper portion of the third isolation region being in contact with the first isolation region and the second isolation region, wherein the third isolation region includes a trench type isolation layer structured to include an isolation trench filled with a gap-filling insulation layer, wherein the first isolation region and the second isolation region are configured to receive an isolation voltage, and wherein a side surface of the first isolation region is spaced apart from the side surface of the photoelectric conversion device facing the side surface of the first isolation region by a first gap, and an upper surface of the second isolation region is spaced apart from the bottom surface of the photoelectric conversion device facing the upper surface of the second isolation region by a second gap, and wherein the isolation voltage has an absolute value higher than a ground voltage and less than an absolute value of a breakdown voltage of the photoelectric conversion device.

11. The image sensing device of claim 10, wherein the photoelectric conversion device further comprises a guard ring formed in the second impurity region, and wherein the guard ring is in contact with the side surface of the first impurity region to surround the first impurity region.

12. The image sensing device of claim 10, wherein each of the first isolation region and the second isolation region comprise an impurity region having the second conductive type, and the first isolation region is electrically connected with the second isolation region.

13. The image sensing device of claim 10, wherein the first isolation region has a pipe shape, the second isolation region has a plate shape, and the first and second isolation regions are structured to isolate the photoelectric conversion device.

14. The image sensing device of claim 10, wherein the second gap is greater than the first gap.

15. The image sensing device of claim 10, wherein the third isolation region comprises a trench type isolation layer having a pipe shape, and the gap-filling layer insulation layer of the third isolation layer includes a plurality of dipoles for capturing charges.

16. The image sensing device of claim 10, wherein the photoelectric conversion device comprises a single photon avalanche diode (SPAD).

* * * * *